United States Patent
Sato et al.

(10) Patent No.: US 7,531,039 B2
(45) Date of Patent: May 12, 2009

(54) SUBSTRATE PROCESSING APPARATUS AND SUBSTRATE PROCESSING SYSTEM

(75) Inventors: Masanobu Sato, Kyoto (JP); Kenya Morinishi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/669,520

(22) Filed: Sep. 24, 2003

(65) Prior Publication Data

US 2004/0055707 A1    Mar. 25, 2004

(30) Foreign Application Priority Data

| Sep. 25, 2002 | (JP) | ............................. 2002-278514 |
| Oct. 4, 2002 | (JP) | ............................. 2002-291880 |
| Oct. 16, 2002 | (JP) | ............................. 2002-301357 |
| Oct. 28, 2002 | (JP) | ............................. 2002-312092 |

(51) Int. Cl.
  *B05C 11/02* (2006.01)
  *B05C 13/02* (2006.01)
  *B05B 1/28* (2006.01)

(52) U.S. Cl. ......................... 118/52; 118/503; 118/326; 118/62

(58) Field of Classification Search ................... 118/52, 118/612, 319, 320, 58, 300, 326, 500–503, 118/62, 63; 156/345.14, 345.54, 345.55, 156/345.23; 134/21, 99.1, 153, 198, 902; 428/690; 427/240
See application file for complete search history.

(56) References Cited

U.S. PATENT DOCUMENTS 5,518,542 A * 5/1996 Matsukawa et al. ........... 118/52
5,601,645 A   2/1997 Nonomura et al. ............ 118/52
5,762,751 A   6/1998 Bleck et al. ................ 156/345

(Continued)

FOREIGN PATENT DOCUMENTS

JP    62-145830    6/1987

(Continued)

OTHER PUBLICATIONS

English Translated Abstract JP-2003060013A.*

(Continued)

*Primary Examiner*—Yewebdar T Tadesse
(74) *Attorney, Agent, or Firm*—Ostrolenk, Faber, Gerb & Soffen, LLP

(57) ABSTRACT

Of a substrate-facing surface 24 of an atmosphere blocking member 2, a central area 241 which is faced with an approximately central portion of a substrate S is a flat surface while a periphery edge area 242 which is faced with a periphery edge of the substrate S is an angled surface which becomes closer to the substrate S with a distance toward a periphery edge of the substrate-facing surface 24. Hence, a micro-space SP between the substrate S and the atmosphere blocking member 2 becomes gradually narrower in a direction R which is toward the periphery edge of the substrate S. As an atmosphere gas is fed into the micro-space SP, the atmosphere gas is compressed in the vicinity of a periphery edge of the micro-space SP and a pressure rises. As a result, the micro-space SP becomes positively pressurized as compared with a mist-splashed atmosphere, which effectively prevents a mist from invading other major surface S2 of the substrate S.

3 Claims, 12 Drawing Sheets

U.S. PATENT DOCUMENTS

| | | | |
|---|---|---|---|
| 6,022,484 A | 2/2000 | Bleck et al. | 216/67 |
| 6,239,038 B1 * | 5/2001 | Wen | 438/745 |
| 2001/0037858 A1 | 11/2001 | Taniyama et al. | 156/345 |
| 2002/0106445 A1 * | 8/2002 | Mito | 427/58 |
| 2003/0131494 A1 * | 7/2003 | Lubomirsky et al. | 34/317 |
| 2004/0040584 A1 * | 3/2004 | Miya et al. | 134/21 |

FOREIGN PATENT DOCUMENTS

| | | |
|---|---|---|
| JP | 5-114554 | 5/1993 |
| JP | 5-283327 | 10/1993 |
| JP | 6-151398 | 5/1994 |
| JP | 6-224170 | 8/1994 |
| JP | 7-130695 | 5/1995 |
| JP | 8-141479 | 6/1996 |
| JP | 8-206570 | 8/1996 |
| JP | 9-290198 | 11/1997 |
| JP | 10-116805 | 5/1998 |
| JP | 10-125648 | 5/1998 |
| JP | 2845738 | 1/1999 |
| JP | 11-40492 | 2/1999 |
| JP | 2906783 | 6/1999 |
| JP | 11-239757 | 9/1999 |
| JP | 11-251284 | 9/1999 |
| JP | 11-330039 | 11/1999 |
| JP | 2001-223195 | 8/2001 |
| JP | 2001-319910 | 11/2001 |
| JP | 2002-96011 | 4/2002 |
| JP | 2003060013 A * | 2/2003 |

OTHER PUBLICATIONS

Japanese Utility Model application Laid-Open Gazette No. 2-137029 (1990).

Office Action issued Feb. 27, 2007 in the Japanese Patent Application No. 2002-312092.

* cited by examiner

FIG. 3A : FIXED HOLDING MEMBER
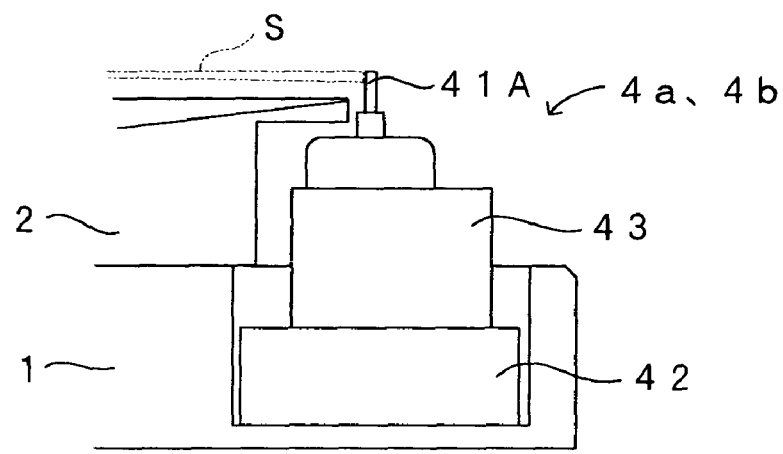
FIG. 3B : MOVABLE HOLDING MEMBER
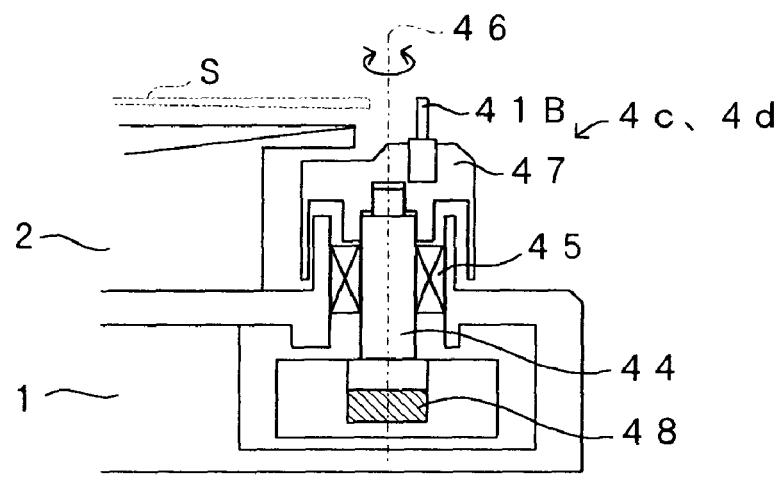

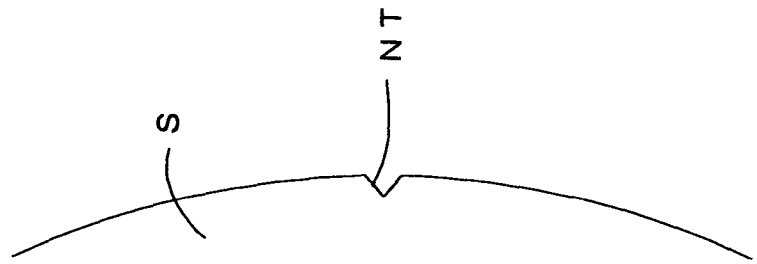
FIG. 6A
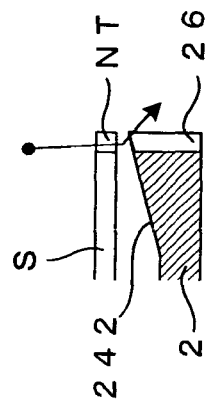
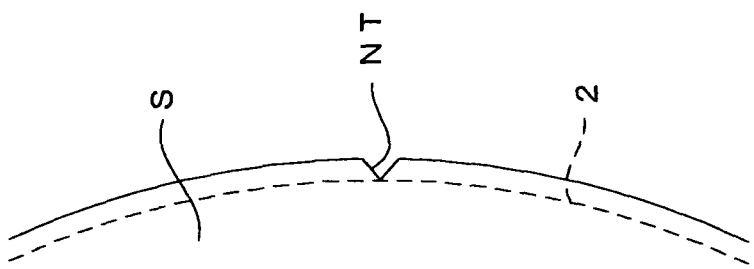
FIG. 6B
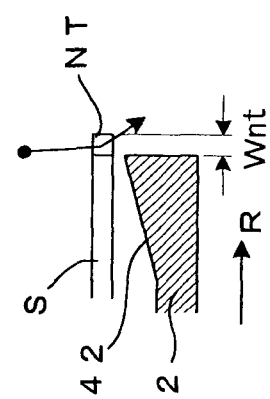
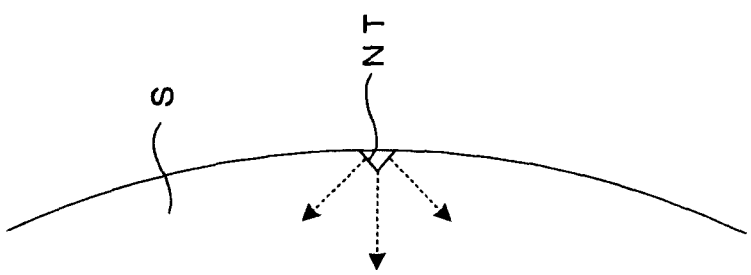
FIG. 6C
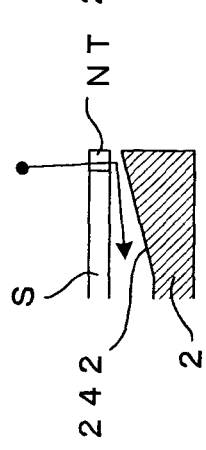

FIG. 13
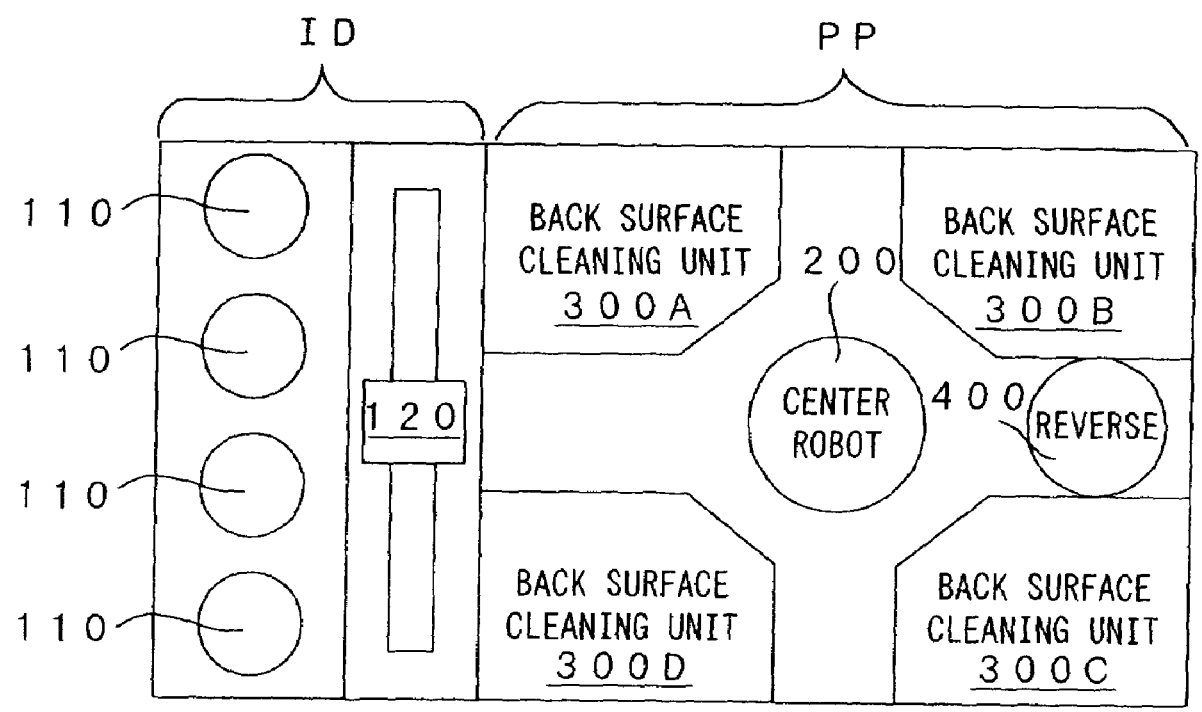
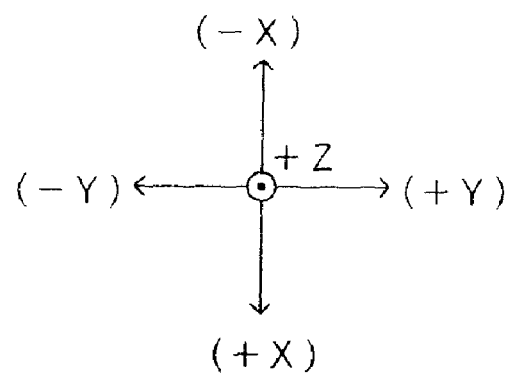

SUBSTRATE PROCESSING APPARATUS AND SUBSTRATE PROCESSING SYSTEM

BACKGROUND OF THE INVENTION

1. Field of the Invention

The present invention relates to a substrate processing apparatus which supplies a processing liquid upon one major surfaces of variety types of substrates such as a semiconductor wafer, a glass substrate for photomask, a glass substrate for liquid crystal display, a glass substrate for plasma display and an optical disk substrate (hereinafter simply referred to as "substrates") and subjects the major surfaces to predetermined substrate processing, and also to a substrate processing system which comprises such an apparatus.

2. Description of the Related Art

Known as this type of substrate processing apparatus is a substrate processing apparatus in which a substrate is held horizontally for instance, processing liquids such as a photoresist liquid, a cleaning liquid, a rinsing liquid and an etching liquid are supplied to the upward facing one (top surface) of major surfaces of a substrate, and the top surface is subjected to predetermined substrate processing. Such a substrate processing apparatus is described in Japanese Utility Model Application Laid-Open Gazette No. H2-137029, Japanese Patent Application Laid-Open Gazette No. H5-283327, U.S. Pat. Nos. 6,022,484 and 5,762,751. In these apparatuses, a substrate is placed on a rotating stage and thus held horizontally. Substrate processing is executed while a bottom surface of the substrate is held in contact with the rotating stage. Hence, a problem that the bottom surface of the substrate is damaged or contaminated could arise in some cases.

Against this background, a technique of holding a substrate as it is lifted up from a rotating stage has been proposed over the recent years. In a substrate processing apparatus according to the proposal, a plurality of substrate holding pins are disposed upright on the rotating stage which seats a substrate and the substrate is positioned and held at an edge of the substrate with these substrate holding pins. As the substrate showered with a processing liquid rotates, the processing liquid spreads all over a top surface, and the surface of the substrate is processed uniformly.

In this manner, since the substrate is held as it is slightly lifted up from a surface of the rotating stage in the conventional apparatus, it is possible to obviate a damage, a contamination and the like of the other major surface (bottom surface) of the substrate which would otherwise occur as the substrate is placed on the rotating stage in contact with the rotating stage. However, this gives rise to a different problem that a mist of the processing liquid splashed around during the substrate processing flies beneath and adheres to the bottom surface of the substrate and the bottom surface of the substrate is consequently contaminated.

To deal with this, techniques which require to dispose a member between a substrate and a rotating stage (Japanese Patent Application Laid-Open Gazette No. H5-114554) or to dispose a vertically movable member (Japanese Patent Application Laid-Open Gazette No. H7-130695 ( 2,845,738), U.S Pat. No. 5,601,645) have been proposed as a solution to the problem above.

By the way, the flying of the mist beneath the substrate is caused by a gap which is created between the bottom surface of the substrate and a periphery edge of a member. Hence, there is a significant relationship between the gap and the flying of the mist. However, while aiming at prevention of the flying of the mist by disposing the member close to the bottom surface of the substrate, the apparatus according to the proposal does not give any special consideration regarding the size of the gap. Due to this, this apparatus does not necessarily realize a sufficient preventive effect.

In addition, although it is desirable to dispose the member as close as possible to the bottom surface of the substrate for a better effect of preventing the flying of the mist, there naturally is a limit to dispose the member at the closest possible position because of bending of the substrate, a dimensional error of the member, an accuracy of assembling the apparatus, etc. Further, when a space between the member and the substrate is negatively pressurized, the mist is whirled into this space and adheres to the bottom surface of the substrate, the member and the like.

Meanwhile, when the gap between the substrate and the rotating stage is made as narrow as possible, it is difficult to use a transportation mechanism which is widely used. This is because of a fact that such a transportation mechanism inserts a transportation arm which holds a substrate into a space which is defined between the rotating stage and other major surface of the substrate and then places the substrate on substrate holding pins. Hence, a reduction of the gap between the substrate and the rotating stage leads to a restriction that a special transportation mechanism is required for transpiration of a substrate, which in turn lowers the versatility of the substrate processing apparatus.

In addition, in the apparatus according to the proposal, e.g., the apparatus described in Japanese Patent Application Laid-Open Gazette No. H7-130695 (U.S. Pat. No. 2,845,738), an outer shape of the vertically movable member is a perfect circle and the vertically movable member is formed slightly larger than a substrate. Hence, a periphery edge of the vertically movable member sticks out beyond the substrate and is exposed to the mist-splashed atmosphere (around the substrate). As a result, the mist created during the substrate processing is kicked back by the periphery edge and jumps toward the bottom surface of the substrate in some cases.

Further, while Japanese Patent Application Laid-Open Gazette No. H7-130695 (U.S. Pat. No. 2,845,738) describes to set the size of the vertically movable member approximately equal to the size of a substrate, this may also give rise to the following problem. That is, a substrate processed with this type of substrate processing apparatus often has a special shape. For example, in the case of a semiconductor wafer which serves as a substrate, there is a nick portion such as a notch and an orientation flat which indicates a crystallographic reference orientation within the plane of the wafer. In other words, a semiconductor wafer is obtained by forming a nick portion at a periphery edge of a semiconductor substrate which has a disk-like shape, and therefore, an outer shape of the semiconductor wafer is not a perfect disk but is generally disk-like. On the contrary, in the apparatus described in Japanese Patent Application Laid-Open Gazette No. H7-130695 (U.S. Pat. No. 2845738) in particular, the outer shape of the vertically movable member is a perfect circle and the size of the vertically movable member is about the same as that of a substrate. Hence, a part of the vertically movable member is exposed to the mist-splashed atmosphere (around the substrate) through the nick portion. As a result, the mist created during the substrate processing is kicked back by the exposed part and jumps toward the bottom surface of the substrate in some cases.

SUMMARY OF THE INVENTION

A principal object of the present invention is to provide a substrate processing apparatus and a substrate processing system which process a substrate in an excellent manner while effectively preventing a mist created during processing from adhering to other major surface of the substrate.

Another object of the present invention is to provide a substrate processing apparatus and a substrate processing system which are versatile and allow to subject a substrate to predetermined substrate processing while maintaining the substrate positioned at a desired substrate processing position.

According a first aspect of the present invention, a substrate-facing surface of an atmosphere blocking member which is faced with the other major surface of a substrate becomes closer to the substrate with a distance toward a periphery edge of the atmosphere blocking member.

According a second aspect of the present invention, an atmosphere blocking member is formed by a member whose outer shape is a circle having a diameter which is the same or smaller than that of a substrate, and a blocking member nick portion is formed at a periphery edge of the member such that the blocking member nick portion corresponds to the substrate nick portion.

According a third aspect of the present invention, an outer shape of an atmosphere blocking member is a circle whose radius is defined as:

(the radius)≦(a distance from the center of a substrate to a substrate nick portion); and the atmosphere blocking member is disposed such that a central axis of the atmosphere blocking member coincides with a central axis of the substrate.

According a fourth aspect of the present invention, an outer shape of an atmosphere blocking member is approximately a similar figure which is the same as or smaller than a plate-like member, and a blocking member nick portion is formed at a periphery edge of the member such that the blocking member nick portion corresponds to the substrate nick portion.

According a fifth aspect of the present invention, an outer shape of a blocking member is approximately a similar figure to a plate-like member whose rate of similarity is expressed as:

(the rate of similarity)≦$Wsb/(Wsb+Wnt)$ where Wsb . . . a distance from the center of a substrate to a nick portion and Wnt . . . a notching depth of the nick portion in a notching direction which is from the center of the substrate toward the nick portion; and the atmosphere blocking member is disposed such that a central axis of the atmosphere blocking member coincides with a central axis of the substrate. According a sixth aspect of the present invention, a gap between a periphery edge of an atmosphere blocking member and the other major surface of a substrate which is supported by a substrate supporting means is 0.3 mm through 1 mm.

According a seventh aspect of the present invention, when a substrate is received by the front edge of a substrate moving member which is positioned at the substrate transfer position, the substrate is moved to and positioned at a substrate processing position while maintaining the front edge of the substrate moving member engaged with the substrate.

According an eighth aspect of the present invention, a substrate processing system comprises: a processing unit whose structure is the same as that of the above substrate processing apparatus; and a transportation unit which transports substrates to the processing unit.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIGS. 3A and 3B are drawings which show a structure of a holding member;

FIGS. 6A through 6C are drawings which show a relationship between a notch of a substrate and the atmosphere blocking member;

FIG. 13 is a drawing which shows a preferred embodiment of a substrate processing system according to the present invention.

DETAILED DESCRIPTION OF THE PREFERRED EMBODIMENTS

Figure 1:
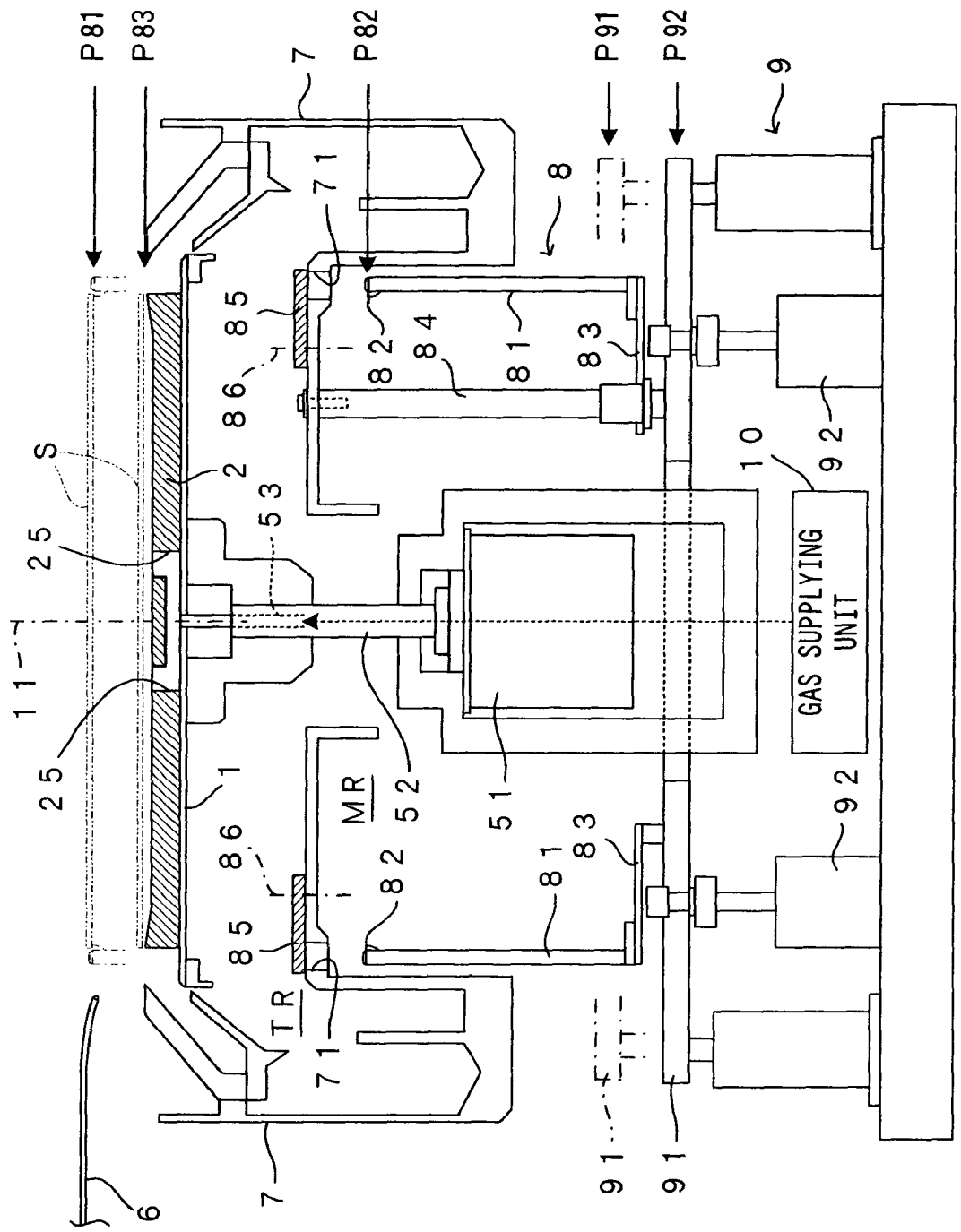
FIG. 1 is a drawing of a preferred embodiment of a substrate processing apparatus according to the present invention.
Figure 2:
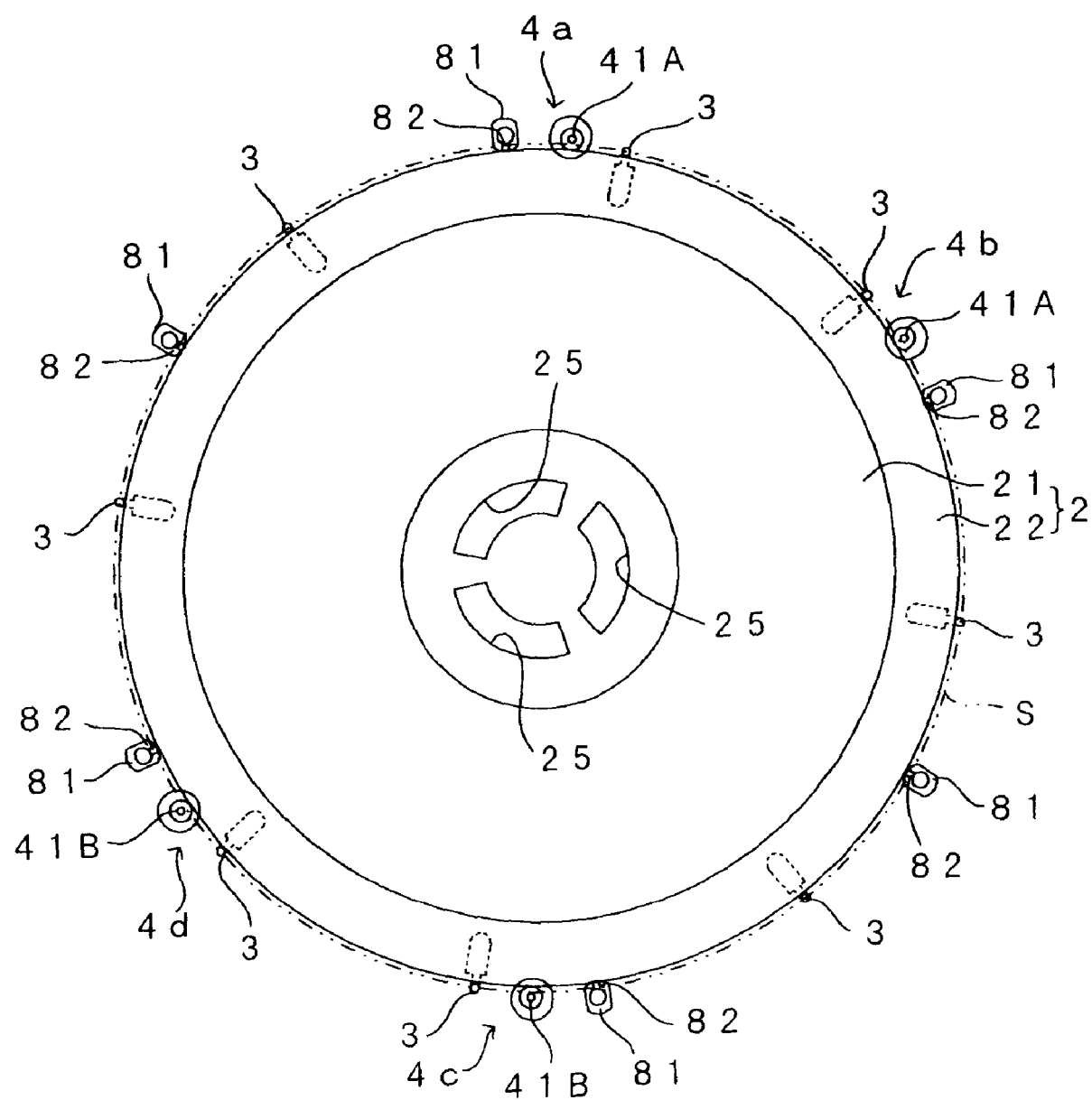
FIG. 2 is a partial plan view of the substrate processing apparatus as it is viewed from above.

FIG. 1 is a drawing of a preferred embodiment of a substrate processing apparatus according to the present invention. FIG. 2 is a partial plan view of the substrate processing apparatus as it is viewed from above. In this substrate processing apparatus, a rinsing liquid such as pure water and a chemical liquid is supplied as a "processing liquid" of the present invention to one major surface S1 which is one of the two major surfaces of a substrate S which may be a semiconductor wafer, and rinsing is then performed on one major surface S1. On the other hand, adhesion of a mist created during rinsing to the other major surface S2 is prevented in the following manner. In short, this substrate processing apparatus is an apparatus which executes rinsing as "substrate processing" of the present invention only on one major surface S1 of the substrate S.

The substrate processing apparatus comprises a spin base 1 whose plan size is slightly larger than the size of the substrate S. An atmosphere blocking member 2 whose plan size is slightly smaller than the size of the substrate S is fixed on a top surface of the spin base 1. In addition, at a periphery edge of the atmosphere blocking member 2, there are eight support pins 3 disposed at approximately equiangular intervals as shown in FIG. 2. The support pins 3 are each capable of abutting on an edge of the substrate S, and support the substrate S approximately horizontally with one major surface S1 directed to above. While the eight support pins 3 thus function as "substrate supporting means" of the present invention in this embodiment, a structure of the substrate supporting means is not limited to this but may be any desired structure which supports a substrate slightly floated from the spin base. Structures, features and the like of the atmosphere blocking member 2 and the support pins 3 will be described in detail later.

Further, for prevention of moving the substrate S supported by the support pins 3 in the horizontal direction, there are four holding members 4a through 4d disposed a periphery edge of the spin base 1. Of these four holding members 4a through 4d, the holding members 4a and 4b are fixed holding members whose holding pins 41A which abut on and hold the substrate S are fixed pins, and the holding members 4c and 4d are movable holding members whose holding pins 41B are movable.

FIGS. 3A and 3B are drawings which show a structure of the holding members. As for the holding members 4a and 4b, as shown in FIG. 3A, a weight 42 is fixed to the spin base 1 and a fixed pin holder 43 is attached to a top surface of the weight 42. The fixed pin holder 43 fixedly holds the fixed holding pin 41A.

Meanwhile, as for the holding members 4c and 4d, as shown in FIG. 3B, a shaft 44 is axially supported relative to the spin base 1 by a bearing 45 about a revolution shaft center 46. In addition, a movable pin holder 47 is attached to a top edge of the shaft 44, and the movable holding pin 41B is attached, as it is eccentric from the revolution shaft center 46, to the movable pin holder 47. Hence, when a magnet 48 operates in response to an operation signal fed from a control unit (not shown) which controls the apparatus as a whole, the shaft 44 and the movable pin holder 47, being affected by electromagnetic force of the magnet 48, rotate about the revolution shaft center 46. As a result, the holding pins 41 move while remaining eccentric to the revolution shaft center 46, and move away or abut on an edge surface of the substrate S. Shown in FIG. 3B is a state that the movable holding pins 41B have moved away. The substrate S is placed on or removed from the support pins 3 in this state. After the substrate S is placed on the support pins 3, the magnet 48 operates, the movable holding pins 41B accordingly move while remaining eccentric, and the movable holding pins 41B are positioned at a substrate holding position at which the pins abut on a side surface of the substrate S. In consequence, the movable holding pins 41B put the substrate S between the movable holding pins 41B and the fixed holding pins 41A and hold the substrate S in the horizontal direction. In this fashion, the eight support pins 3 hold the substrate approximately horizontally and the four holding pins 41A, 41A, 41B and 41B restrict horizontal movements of the substrate S in this embodiment.

Further, as shown in FIG. 1, an output rotation shaft 52 of a motor 51 which corresponds to "rotation means" of the present invention is linked to the spin base 1, and the spin base 1 rotates as the motor 51 operates. Owing to this, the substrate S which is held above the spin base 1 by the support pins 3 and the holding pins 41A and 41B rotates about a revolution shaft center 11 together with the spin base 1 and the atmosphere blocking member 2.

For supply of a rinsing liquid to one major surface S1 of the substrate S which is thus driven into rotations, a rinsing liquid supply nozzle 6 is disposed at a position which is above and oblique relative to the atmosphere blocking member 2. A rinsing liquid compressor unit not shown is connected with the rinsing liquid supply nozzle 6. Fed under pressure from the rinsing liquid compressor unit at such timing which will be described later, the rinsing liquid gushes out from the rinsing liquid supply nozzle 6 toward one major surface S1 of the substrate S which is supported by the support pins 3. As the substrate S which has thus received the rinsing liquid rotates, the rinsing liquid spreads all over one major surface S1 of the substrate S because of centrifugal force, whereby the substrate is rinsed. In order to collect the liquid which is shook off from the substrate S at this stage, a cup 7 is disposed which surrounds the spin base 1. The number of revolutions of the substrate S needs be higher than the lower limit number of revolutions to drain off the rinsing liquid from the substrate S. Considering wettability of a semiconductor wafer which is the substrate S and pure water which is the rinsing liquid, the number of revolutions of the substrate S is set to 300 rpm or higher in this embodiment. In this context, the "lower limit number of revolutions" refers to the minimum number of revolutions which is needed to drain off a processing liquid from a substrate, and is determined based on the size of substrates, wettability of one major surface of a substrate and a processing liquid, etc.

Further, in this embodiment, since the support pins 3 support the substrate S, a gap between the substrate S and the atmosphere blocking member 2 is narrow. Although this imposes a restriction that an arm of a transportation robot or the like cannot be inserted into the gap, the preferred embodiment realizes transportation of a substrate using a lift mechanism 8 as described below and thus makes it possible to process a substrate while supporting the substrate with the substrate support pins 3 despite this restriction. That is, the lift mechanism 8:

receives an unprocessed substrate S from a transportation robot;

places the unprocessed substrate S on the support pins 3;

receives the processed substrate S as it is after rinsed from the support pins 3; and transfers the processed substrate S to the transportation robot.

In this embodiment, the lift mechanism 8 comprises six lifter pin stands 81 which extend in the vertical direction, support parts 82 attached to top edges (front edges) of the respective lifter pin stands 81, a link plate 83 which links the lifter pin stands 81 to each other at bottom edges of the lifter pin stands 81, and an actuator 84 such as an air cylinder which moves the link plate 83 in the vertical direction. The lifter pin stands 81, the support parts 82 and the link plate 83 constitute a "substrate moving member" of the present invention which is capable of moving toward above and below in the vertical direction while maintaining engaged with a periphery edge of the substrate S. The actuator 84 as it is alone functions as a "vertical drive mechanism" which drives the substrate moving member toward above and below.

When the link plate 83 moves toward above as the actuator 84 operates in response to an operation instruction fed from the control unit, the six lifter pin stands 81 ascend as one unit. As this proceeds, the support parts 82 move up to a substrate processing position P83 at which substrate processing is to take place from below the substrate processing position P83, and engage with the periphery edge of the substrate S which is supported by the support pins 3. Upon arrival at a position above the support pins 3, the support parts 82 receive the substrate S from the support pins 3. At this stage, the support parts 82 support the substrate S at the periphery edge of the substrate S, instead of the support pins 3. After reaching an upper limit position, the support parts 82 move to a substrate transfer position P81 which is above and away from the atmosphere blocking member 2 while holding thus processed substrate S, at which stage it is possible to transfer the processed substrate S to the transportation robot.

At the substrate transfer position P81, transfer of an unprocessed substrate S from the transportation robot is possible. After receipt of an unprocessed substrate S, the link plate 83 moves toward below as the actuator 84 reversal operates in response to an operation instruction fed from the control unit, the six lifter pin stands 81 descend as one unit. As this proceeds, the support parts 82 move to a position below the substrate processing position P83, and the unprocessed substrate S is placed on the support pins 3. When the support parts 82 retract to a lower limit position (retracted position) P82, the substrate comes to a position which is lower than the cup 7, thereby making it possible to rinse the substrate.

In this embodiment, to prevent the lifter p in stands 81 and the support parts 82 from interfering with the cup 7, the cup 7 comprises passage holes 71 for the lifter pin stands 81 and the support parts 82 to pass through. Shutters 85 which control opening and closing of the passage holes 71 are also disposed. In other words, in the vicinity of the passage holes 71, the shutters 85 are axially supported for free revolutions relative to the cup 7 about a revolution shaft center 86. The control unit controls opening and closing of the shutters 85 in accordance with operations of a shutter actuator not shown. Hence, during rinsing, the lifter pin stands 81 and the support parts 82 retract to a lower position than the cup 7, the respective passage holes 71 are closed with the shutters 85 and an atmosphere inside the cup 7 is accordingly prevented from flowing into the lift mechanism 8 without fail. To be more specific, since the cup 7 is disposed surrounding a substrate S which is positioned at the substrate processing position P83 and the passage holes 71 of the cup 7 are shuttered with the shutters, a processing space TR in which rinsing is performed as substrate processing is separated from a mechanism space MR in which the lift mechanism 8 is disposed. This securely prevents a mist created within the cup 7 or the like from invading the mechanism space MR and accordingly contaminating the lift mechanism 8. In this embodiment, the cup 7 and the shutters 85 thus function as "separating means" of the present invention. The shutter actuator which drives the shutters 85 to open and close may be an air cylinder, a solenoid, a motor, etc.

Figure 4:
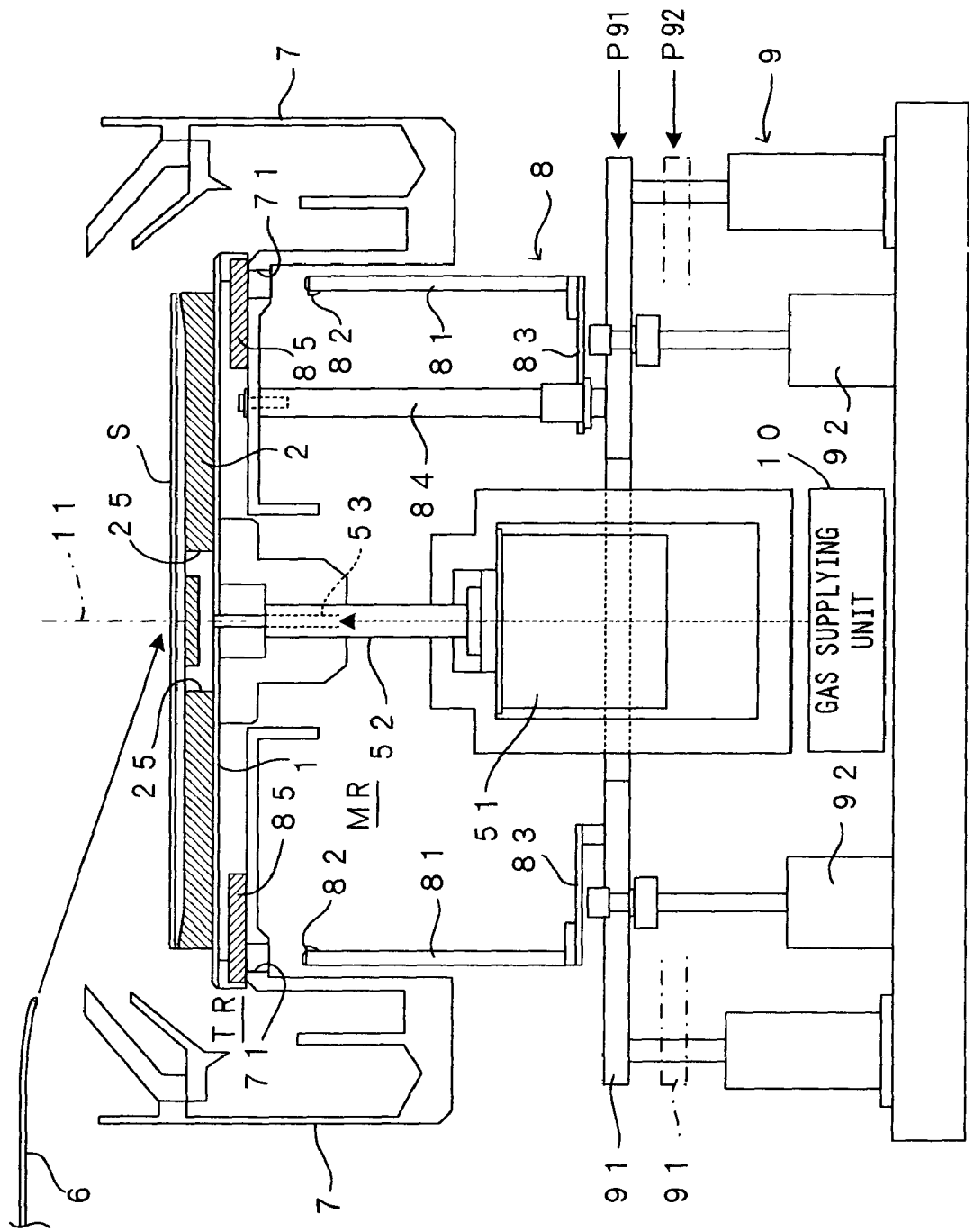
FIG. 4 is a drawing which shows a rinsing operation of the substrate processing apparatus which is shown in FIG. 1.

Further, this embodiment uses a vertical travel mechanism 9 which allows the cup 7 and the lift mechanism 8 to ascend as one unit. The vertical travel mechanism 9 comprises a vertical travel table 91 which is linked to the actuator 84 of the lift mechanism 8 and the cup 7. In addition, actuators 92 such as a plurality of air cylinders are connected to the vertical travel table 91. Hence, as the actuators 92 operate in response to a vertical travel instruction fed from the control unit, the vertical travel table 91 ascends or descends, whereby the cup 7 and the lift mechanism 8 move up or down as one unit. In FIG. 1 for example, the actuators 92 have moved the vertical travel table 91 down to a lower limit position P92, which state permits to load and unload a substrate S. As the actuators 92 move the vertical travel table 91 up to an upper limit position P91 which is denoted at the dashed and dotted lines in FIG. 1, the cup 7 and the lift mechanism 8 move toward above as one unit in accordance with the upward movement of the vertical travel table 91, thereby making it possible to rinse. FIG. 4 shows such a state that it is possible to rinse.

In the substrate processing apparatus having such a structure as described above, the control unit controls the respective portions of the apparatus in accordance with a program which has been stored in a memory of the control unit in advance, and an unprocessed substrate is loaded, rinsing is performed, and a processed substrate is unloaded.

First, with the vertical travel table 91 positioned at the lower limit position P92 (FIG. 1), an unprocessed substrate S is loaded (loading of an unprocessed substrate). To be more specific, after opening of the shutters 85 as driven by the shutter actuator not shown, the lifter pin stands 81 ascend as the lifter actuator 84 operates and the support parts 82 are positioned at the substrate transfer position P81. Upon receipt of the unprocessed substrate S from the transportation robot at the substrate transfer position P81, the actuator 84 reversal operates, and the lifter pin stands 81 descend as one unit while the support parts 82 support the substrate S at the periphery edge of the substrate S. Hence, when the support parts 82 move down to the substrate processing position P83, the periphery edge of the substrate S supported by the support parts 82 engages with the support pins 3. As the support parts 82 move further down to a lower position than the support pins 3, the unprocessed substrate S is placed on the support pins 3. Following this, the holding pins 41B of the movable holding members 4c and 4d move to the substrate holding position and firmly hold the substrate S. The shutters 85 are closed when the lifter pin stands 81 reach the lower limit position P82 and rest at the lower position than the cup 7. The timing of closing the shutters 85 is not limited to this. It is needless to mention that the shutters 85 may be closed at any appropriate timing after the top edges (the support parts 82) of the lifter pin stands 81 have passed through the passage holes 71 and the lifter pin stands 81 have moved into the mechanism space MR.

After an appropriate period of time from closing of the shutters 85, the cup 7 is moved up to a rinsing position and rinsing is executed. In short, as shown in FIG. 4, after the vertical travel table 91 is moved to the upper limit position P91 by the actuators 92, the rinsing liquid is injected from the rinsing liquid supply nozzle 6 toward one major surface S1 of the substrate S which is supported by the support pins 3, while the motor 51 is actuated and the substrate S accordingly rotates about the revolution shaft center 11. Rinsing is thus performed (rinsing).

After rinsing has completed, the supply of the rinsing liquid from the rinsing liquid supply nozzle 6 is stopped while still rotating the substrate S, thereby draining off the liquid adhering to the substrate S and drying the substrate. The motor 51 is stopped and the substrate S is accordingly stopped upon completion of the rotating/drying processing. After the vertical travel table 91 is moved to the lower limit position P92 by the actuators 92, the shutters 85 are opened, the actuator 84 is activated, and the lifter pin stands 81 accordingly ascend. As a result, upon arrival of the support parts 82 at a higher position than the substrate processing position P83, thus processed substrate S is transferred to the support parts 82 from the support pins 3 and positioned at the substrate transfer position P81. The processed substrate S is then transferred to the transportation robot and unloaded from the apparatus (unloading of a processed substrate). Upon unloading of the substrate, in a similar manner to that described above, the lifter pin stands 81 are positioned at a lower position than the cup 7 and the shutters 85 are closed.

The series of operations is repeated, whereby a plurality of substrates S are rinsed continuously on one major surfaces S1 of the substrates S.

As described above, in the substrate processing apparatus according to the preferred embodiment, after a substrate S is received by the support parts 82 which are attached to the top edges of the lifter pin stands 81 at the substrate transfer position P81 which is above the substrate processing position P83, the support parts 82 of the lifter pin stands 81 move to the substrate processing position P83 in a condition that the support parts 82 maintaining engaged with a periphery edge of the substrate S, and the substrate S is accordingly positioned at the substrate processing position P83. In this manner, it is possible to position the substrate S at the substrate processing position P83 without touching the other major surface S2 of the substrate S, and hence, to prevent contamination of the other major surface S2 of the substrate S. Further, since the substrate S is positioned at the substrate processing position P83 after received at the substrate transfer position P81 instead of positioning the substrate S directly at the substrate processing position P83 as is customarily practiced in conventional apparatuses, it is possible to transfer the substrate S even when the space at the other major surface S2 is very narrow due to the atmosphere blocking member 2 as described above. It is of course possible to apply a similar mechanism to the life mechanism 8 of this embodiment to a substrate processing apparatus in which the atmosphere blocking member 2 is not used and the space at the other major surface S2 of a substrate S is relatively large. In other words, the life mechanism 8 of this embodiment is a highly versatile mechanism.

Figure 5A:
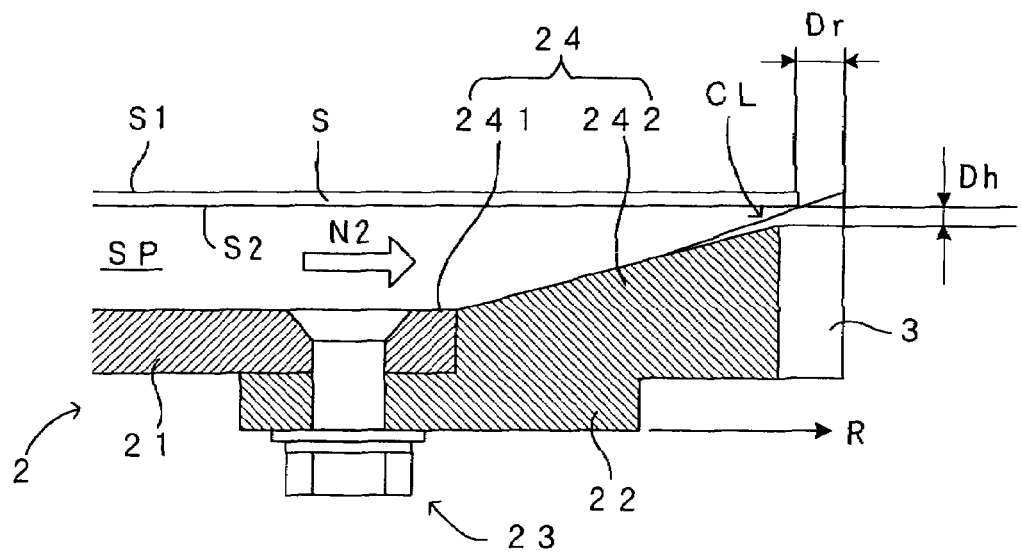
FIGS. 5A and 5B are drawings which show a structure of a section in the vicinity of a periphery edge of an atmosphere blocking member.
Figure 5B:
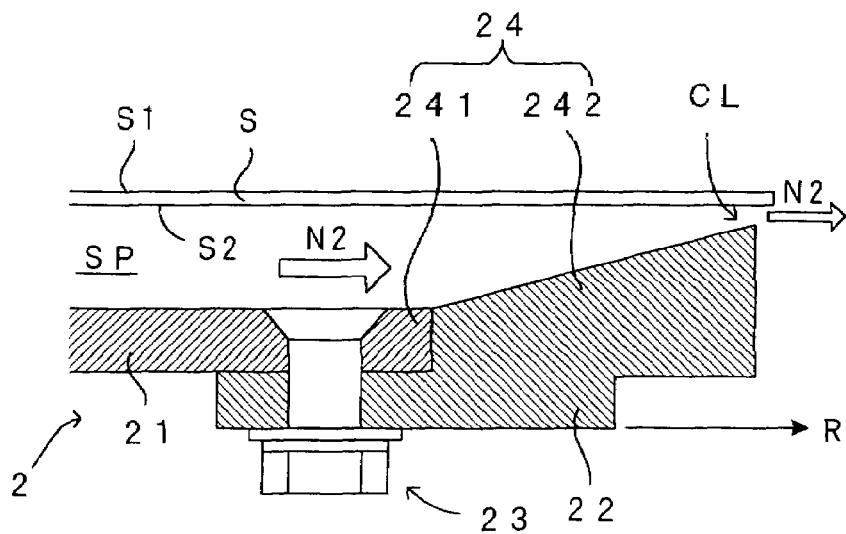

A structure of the atmosphere blocking member 2 will now be described in detail with reference to FIGS. 1, 2, 5A and 5B. FIGS. 5A and 5B are drawings which show a structure of a section in the vicinity of a periphery edge of the atmosphere blocking member. Shown in FIG. 5A is a section in which the support pin has placed and a structure around the same, while shown in FIG. 5B is a section in which the support pin has not placed and a structure around the same. The atmosphere blocking member 2 is disposed to the top surface of the spin base 1 in such a manner that a top surface 24 of the atmosphere blocking member 2 is, as a substrate-facing surface, faced with the other major surface (bottom surface) S2 of a substrate S which is supported by the support pins 3 and that the top surface 24 is away from the substrate S. The atmosphere blocking member 2 is obtained by fastening a disk-shaped flat panel member 21 and a donut-shaped ring member 22, which is disposed surrounding the flat panel member 21, using a fastening member 23 such as a bolt and a nut. As described earlier, the plan size of the atmosphere blocking member 2 as a whole is slightly smaller than the size of the substrate S. The reason of setting the plan size in such a manner will be described later.

As for the substrate-facing surface 24 which is faced with the substrate S, of the two major surfaces of the atmosphere blocking member 2, a central area 241 faced with an approximately central portion of the substrate S is a flat surface but a periphery edge area 242 faced with the periphery edge of the substrate S is an angled surface which comes closer to the substrate with a distance toward the periphery edge of the substrate-facing surface 24. Hence, a micro-space SP between the substrate S and the atmosphere blocking member 2 becomes gradually narrower along a direction R which is toward the periphery edge of the substrate S although remaining relatively wide in a central portion. At the periphery edge of the atmosphere blocking member 2, a micro-clearance CL between the substrate S and the atmosphere blocking member 2 is a very fine gap Dh which is 0.3 mm through 1 mm for instance or more preferably 0.3 mm through 0.8 mm.

As described above, in this embodiment, the atmosphere blocking member 2 isolates the other major surface (bottom surface) S2 of the substrate S from the region around the substrate S, namely, a mist-splashed atmosphere, thereby making it possible to prevent a mist created during rinsing from invading the other major surface S2 of the substrate S.

In addition, invasion of the mist is prevented further effectively, as the micro-space SP is positively pressurized as compared with the mist-splashed atmosphere (the region around the substrate S) as described in the following. That is, there are through holes 25 in an approximately central portion of the atmosphere blocking member 2 as shown in FIGS. 1 and 2. The through holes 25 are connected with a pipe 53 which is installed within a hollow part of the output rotation shaft 52, so that a atmosphere gas such as nitrogen gas and inert gas which is pressure-fed from a gas supplying unit 10 arrives at the micro-space SP via the pipe 53 and the through holes 25. Further, since the substrate-facing surface 24 becomes closer to the substrate S with a distance along the direction R which is toward the periphery edge of the substrate S, the atmosphere gas thus pressure-fed via the through holes 25 is compressed in the vicinity of a periphery edge of the micro-space SP, and the pressure rises. As a result, the micro-space SP is positively pressurized as compared with the mist-splashed atmosphere, whereby the mist is effectively prevented from invading the other major surface S2 of the substrate S.

A flow rate of the atmosphere gas which is necessary to prevent the mist invasion was simulated through various experiments and using a computer on an assumption that the micro-clearance CL was 0.3 mm to 0.5 mm for example. The required flow rate was found to be 20 (liters/min) or higher. On an assumption that the micro-clearance CL was 0.5 mm to 1 mm for instance, the required flow rate was found to be 100 (liters/min) or higher. While the flow rate of the atmosphere gas may be enhanced as the micro-clearance CL becomes larger as thus suggested, if the flow rate of the atmosphere gas is supplied at 200 (liters/min) or higher, the substrate S will float up from the support pins 3 and accordingly become instable. The maximum flow rate needs therefore be about 200 (liters/min), in accordance with which the micro-clearance CL needs be set to 1 mm or smaller.

On the contrary, while the necessary flow rate of the atmosphere gas becomes low as the micro-clearance CL becomes narrow, if the micro-clearance CL is set to 0.3 mm or smaller, the rinsing liquid will invade the space SP due to the capillary effect. Hence, the micro-clearance CL needs be set to 0.3 mm or larger.

When the micro-clearance CL is ensured to have the gap Dh of 0.3 mm through 1 mm as described above, it is possible to prevent an undesirable invasion of a mist via the micro-clearance CL while maintaining the substrate S in a stable posture supported by the support pins 3. Further, in order to reduce the flow rate of the atmosphere gas which is fed into the micro-space SP for an even more stable posture of a substrate and for substrate processing at a low running cost, the gap of the clearance is preferably 0.3 mm through 0.8 mm, and further preferably, 0.3 mm through 0.5 mm.

In addition, since the substrate-facing surface 24 has such a structure as described above, the flow velocity of the atmosphere gas which gushes out from the micro-clearance CL enhances and becomes higher than a speed at which the mist is splashed. This works to an advantage for prevention of mist invasion, and even more securely prevents the mist from adhering to the other major surface S2 of the substrate S.

The reason of setting the plan size of the atmosphere blocking member 2 slightly smaller than the size of a substrate S will now be described with reference to FIGS. 6A through 6C. First, if the plan size of the atmosphere blocking member 2 is larger than the size of a substrate S, the periphery edge of the atmosphere blocking member 2 will stick out beyond the substrate S in the horizontal direction and a portion of the substrate-facing surface 24 of the atmosphere blocking member 2 (i.e., the periphery edge area 242 which is an angled surface) will be exposed to the mist-splashed atmosphere (around the substrate). A mist created during rinsing will therefore be kicked back at the periphery edge area 242 and splashed toward the other major surface (bottom surface) S2 of the substrate S. On the contrary, when the plan size of the atmosphere blocking member 2 is set to be the same as or smaller than the size of the substrate S, the substrate-facing surface 24 is not exposed to the mist-splashed atmosphere, thus solving the problem above. In this respect alone, the atmosphere blocking member 2 may have the same size as the substrate S.

However, since a substrate S often has a special shape, it is desirable to set the plan size of the atmosphere blocking member 2 considering this. For example, a semiconductor wafer which serves as a substrate S comprises a notch NT which indicates a crystallographic reference orientation within the plane of the wafer as shown in FIGS. 6A through 6C. Hence, if the atmosphere blocking member 2 has the same size as the substrate S, as shown in FIG. 6A, a portion of the substrate-facing surface 24 of the atmosphere blocking member 2 (i.e., the periphery edge area 242) will be exposed to the mist-splashed atmosphere (around the substrate) through the notch NT. A mist created during rinsing will therefore be kicked back at the periphery edge area 242 and splashed toward the other major surface (bottom surface) S2 of the substrate S. On the contrary, when the plan size of the atmosphere blocking member 2 is smaller by a width Wnt of the notch NT along a radial direction R as shown in FIG. 6B, the substrate-facing surface 24 is not exposed to the mist-splashed atmosphere, thus solving the problem above. In this respect, it is preferable to set the plan size of the atmosphere blocking member 2 smaller than that of the substrate S merely by the width Wnt of the notch NT or more. This will now be described in more detail with reference to FIG. 7.

Figure 7:
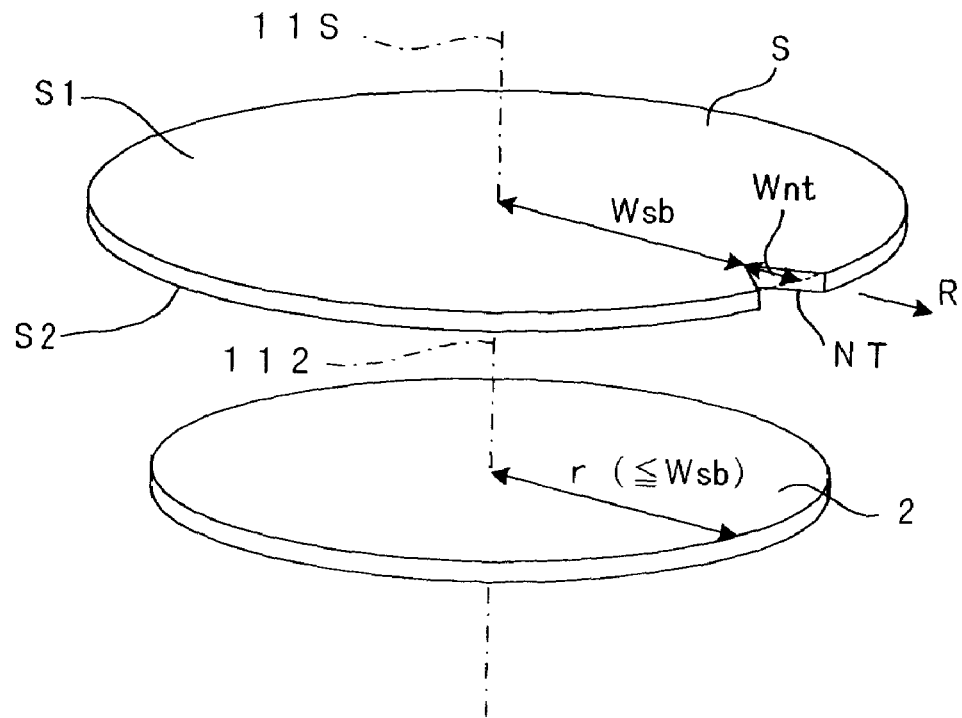
FIG. 7 is a perspective view which shows a relationship between a notch of a substrate and the atmosphere blocking member.

FIG. 7 is a perspective view which shows a relationship between a notch of a substrate and the atmosphere blocking member. For clarification of a relationship between the notch NT which corresponds to a "substrate nick portion" of the present invention and the atmosphere blocking member 2, the notch NT is enlarged and a distance between the substrate S and the atmosphere blocking member 2 is enlarged in FIG. 7. The illustrated substrate S is obtained by providing the notch NT at a periphery edge of a plate-like member which has a predetermined shape (namely, a disk shape in the illustrated example). A notching depth of the notch NT along a notching direction R which is from the center of the substrate S to the notch NT corresponds to the width Wnt described above. A distance from the center of the substrate S to the notch NT is a value which is obtained by subtracting the notching depth Wnt from the radius of the plate-like member, i.e., a distance Wsb.

In this embodiment, the outer shape of the atmosphere blocking member 2 is a circular shape whose radius satisfies the following inequality:

(the radius r)≦(the distance Wsb from the center of the substrate S to the notch NT).

Further, the atmosphere blocking member 2 is disposed such that a central axis 112 of the atmosphere blocking member 2 matches with a central axis 11S of the substrate S. Hence, the periphery edge of the atmosphere blocking member 2 remains closer to the central axis than the notch NT is, without sticking out beyond the substrate S in the horizontal direction. In other words, wherever the notch NT is, the atmosphere blocking member 2 will not be exposed to an atmosphere which is splashed with a mist. The mist will therefore not collide with the atmosphere blocking member 2, thereby preventing the mist from invading the other major surface S2 of the substrate S and effectively obviating adhesion of the mist to the other major surface S2 of the substrate S.

A lower limit value of the plan size (the radius r) of the atmosphere blocking member 2 may be set in accordance with a surface condition of the other major surface S2 of the substrate S. In short, since a protection-requiring area of the other major surface S2 which needs be protected against adhesion of a mist without fail is a central portion of the substrate, the lower limit value of the plan size may be set freely to the extent that the periphery edge of the atmosphere blocking member 2 is located outside the protection-requiring area.

In addition, to prevent the notch NT from influencing the substrate S, a notch 26 may be formed at the periphery edge of the atmosphere blocking member 2 to correspond to the notch NT of the substrate S and rinsing may be performed in a condition that the notch NT of the substrate S is faced with the notch 26 of the atmosphere blocking member 2. This eliminates exposure of the substrate-facing surface 24 to the mist-splashed atmosphere and solves the problem above, as in the example shown in FIG. 6B. This will now be described in more detail with reference to FIG. 8.

Figure 8:
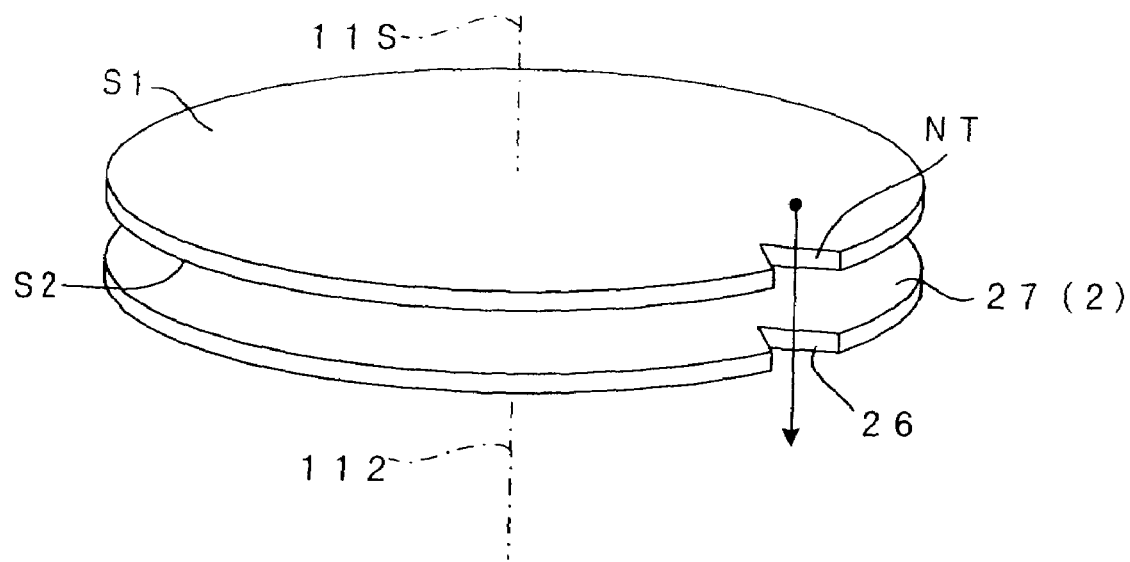
FIG. 8 is a perspective view which shows a relationship between a notch of a substrate and a notch of the atmosphere blocking member.

FIG. 8 is a perspective view which shows a relationship between a notch of a substrate and a notch of the atmosphere blocking member. For clarification of a relationship between the notch NT which corresponds to a "substrate nick portion" of the present invention and the notch 26 which corresponds to a "blocking member nick portion" of the present invention, the notches NT and 26 are enlarged and a distance between the substrate S and the atmosphere blocking member 2 is enlarged in FIG. 8. The illustrated substrate S is obtained by forming the notch NT at a periphery edge of a plate-like member which has a predetermined shape (namely, a disk shape in the illustrated example) as described above.

In this embodiment, the outer shape of the atmosphere blocking member 2 is constituted by a member 27 which is a similar figure which is the same or smaller than the plate-like member and the notch (the blocking member nick portion) 26 is formed at a periphery edge of the member 27 so as to correspond to the notch NT. Due to this, the atmosphere blocking member 2 which is disposed close to the substrate S and faced with the other major surface S2 of the substrate S does not stick out beyond the substrate S in the horizontal direction. Further, since there is the notch 26 at the periphery edge of the member 27 so as to correspond to the notch NT, a mist flying through the notch NT flies further through the notch (the blocking member nick portion) 26. The mist will therefore not collide with the atmosphere blocking member 2, thereby preventing the mist from invading the other major surface S2 of the substrate S and effectively obviating adhesion of the mist to the other major surface S2 of the substrate S.

In addition, since the lifter pin stands 81 and the support parts 82 of the life mechanism 8 ascend passed the atmosphere blocking member 2 as described earlier, it is preferable to set the plan size of the atmosphere blocking member 2 considering this. For example, the plan size of the atmosphere blocking member 2 may be set small so that the atmosphere blocking member 2 will not interfere with the travel paths of the lifter pin stands 81 and the support parts 82. Alternatively, the atmosphere blocking member 2 may be partially notched.

A structure of the support pins will now be described with reference to FIGS. 5A, 9, 10A and 10B. The support pin 3 is disposed at a distance Dr which is 0 mm through 1 mm for instance beyond the periphery edge of the atmosphere blocking member 2 in the radial direction R as shown in FIG. 5A. As an angled support surface 31 directed toward a substrate S abuts on the edge surface of the substrate S, the support pin 3 supports the substrate S. The support pins 3 thus correspond to "support members" of the present invention in this embodiment. The support pins 3 support the substrate S as the angled support surfaces 31 which are "contact surfaces" of the present invention come into a line contact with the edge surface of the substrate S, in such a manner that the microclearance CL has the predetermined gap Dh.

Figure 9:
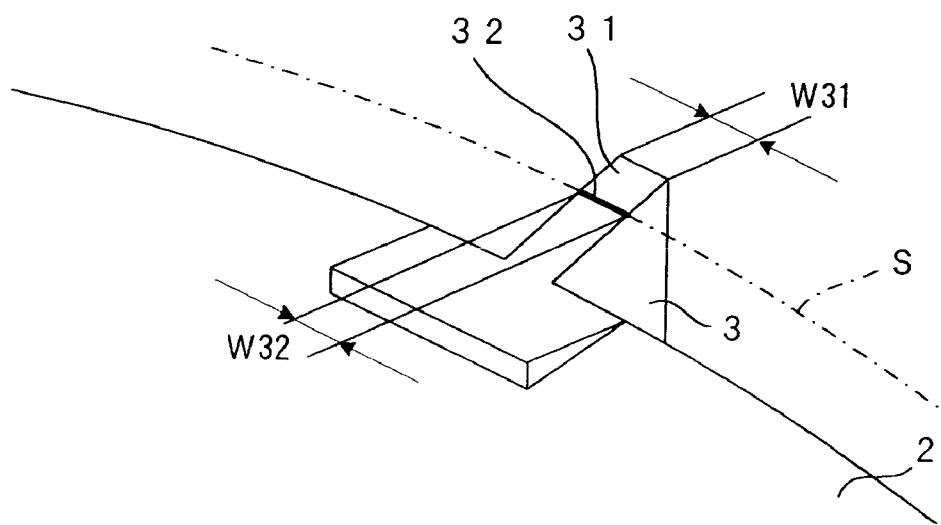
FIG. 9 is a drawing of a support pin.
Figure 10A:
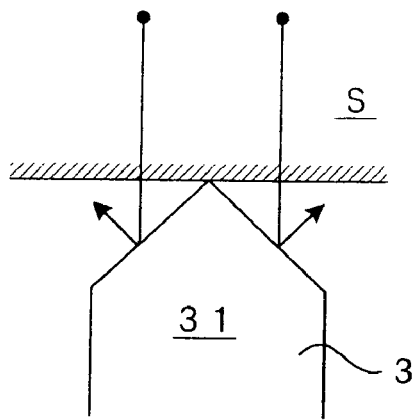
FIGS. 10A and 10B are schematic drawings which show a state of a splashed mist which is kicked back by an angled support surface of a support pin.
Figure 10B:
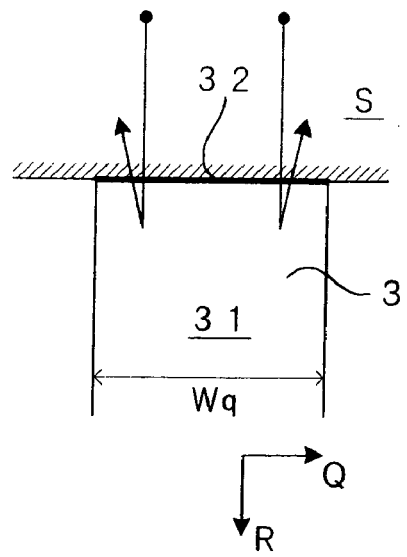

A width W31 of the angled support surface 31 is approximately equal to a width W32 of a line contact portion 32 at which the angled support surface 31 contacts the edge surface of the substrate S. This attains the following effect. That is, in the event that a portion of the support pin 3 sticks out beyond the periphery edge of the atmosphere blocking member 2 in the radial direction R as shown in FIG. 5A or 9, this portion of the angled support surface 31 gets exposed to a mist-splashed atmosphere and a mist is kicked back at this exposed area. Noting this, a substrate is very often supported by means of a point contact in this field of technologies. One such approach is to support a substrate S by means of a point contact as shown in FIG. 10A for instance. However, when a substrate is supported in this fashion, a clearance is created between the substrate S and the support pins 3, which may in some cases allow a mist kicked back at exposed areas of the angled support surfaces 31 to invade the other major surface (bottom surface) of the substrate S through this clearance. On the contrary, since the width W31 of the angled support surface 31 is approximately equal to the width W32 of the line contact portion 32 in this embodiment, a clearance described above as that shown in FIG. 10B will not be created. It is thus possible to securely prevent a mist kicked back at exposed areas of the angled support surfaces 31 from reaching the other major surface (bottom surface) of the substrate S.

While the support pins 3 have such a structure which ensures that widths Wq of the angled support surfaces 31 in a direction Q of a line contact with the edge surface of the substrate S have a constant value W31 (=W32) in this example, the shape of the support pins 3 is not limited to this. Instead, the support pins 3 may have a structure that the width Wq becomes smaller with a distance away from the substrate S, i.e., with a distance along the radial direction R, which also attains a similar effect to that according to the preferred embodiment described earlier.

In addition, while the foregoing has described the structure of the support pins 3 which eliminates any clearance with a substrate S, the foregoing is directly applicable to the holding pins 41A and 41B, too. That is, although the preferred embodiment described above uses the holding pins 41A and 41B which are shaped like a column as shown in FIGS. 3A and 3B, it is desirable to use holding pins which have shapes as those shown in FIGS. 11A through 11D for instance in order to eliminate a clearance with a substrate S. To be more specific, the holding pin 41 may have a structure that a width Wq of the holding pin 41 in the direction Q of a line contact with the edge surface of the substrate S is equal to a width W49 of a line contact portion 49 (FIG. 11A) or becomes narrower with a distance away from the substrate S, i.e., with a distance along the radial direction R (FIGS. 11B through 11D). According to various experiments and computer simulations conducted by the inventor of the present invention, it is preferable to use holding pins which have the following shapes and sizes.

(1) It is preferable that the holding pins 41A and 41B are like a column whose Ø is 1 through 3 mm. This is because a diameter exceeding 3 mm increases an amount of the rinsing liquid colliding with the holding pins 41A and 41B and hence an amount of a splashed mist. Another reason is because a clearance between the holding pins 41A and 41B and the substrate S increases and a mist reaches the other major surface (bottom surface) of the substrate S. On the other hand, when the diameter is smaller than 1 mm, a physical strength becomes insufficient and the substrate S is held unstably.

Figure 11A:
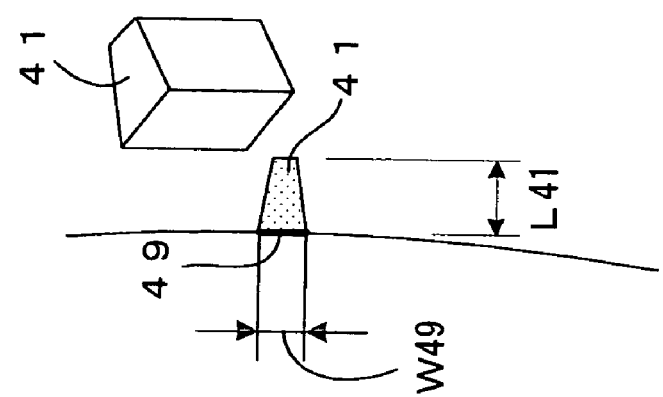
FIGS. 11A through 11D are drawings which show a modification of a support pin.
Figure 11B:
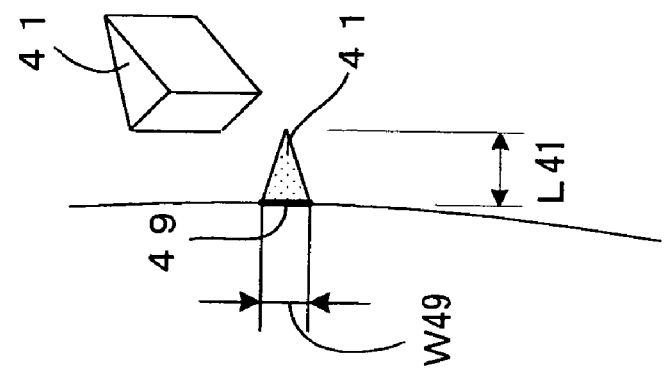
Figure 11C:
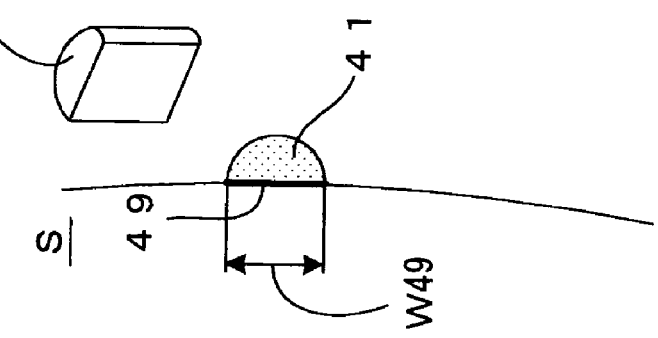
Figure 11D:
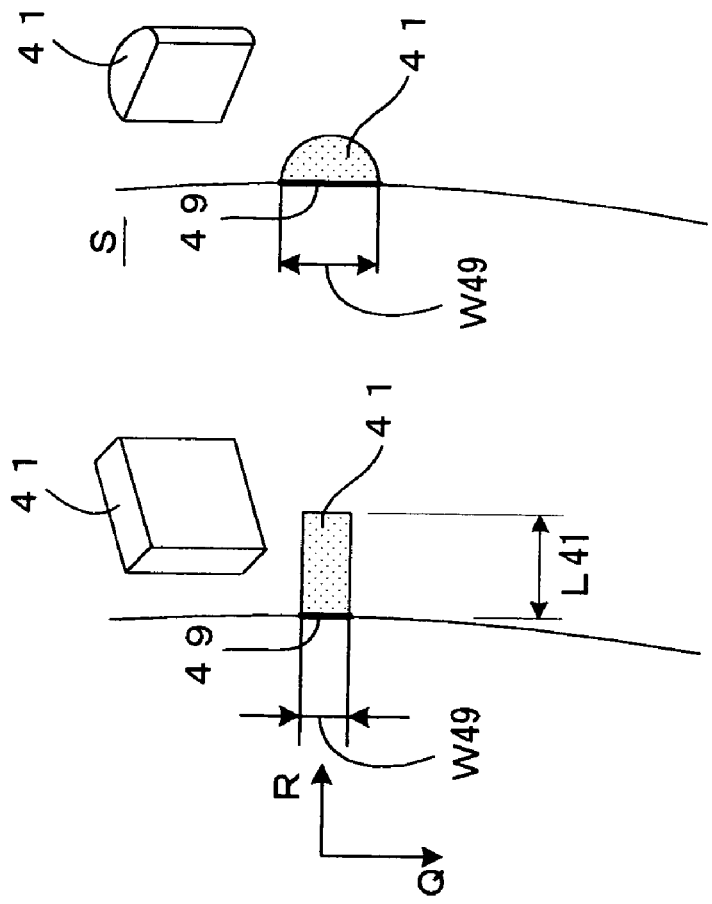

(2) The holding pin 41 shown in FIG. 11A is preferably a rectangle in which the width W49 of the line contact portion 49 with the substrate S is 1 mm through 4 mm and a length L41 in the direction R is 1 mm through 5 mm. This is because the width W49 exceeding 4 mm increases an amount of the rinsing liquid colliding with the holding pin 41 and hence an amount of a splashed mist. On the contrary, when the diameter is smaller than 1 mm, a physical strength becomes insufficient and the substrate S is held unstably.

(3) The holding pin 41 shown in FIG. 11B preferably has a semi-circular shape or a shape of a semi-elliptic cylinder in which the width W49 of the line contact portion 49 with the substrate is 1 mm through 4 mm and the length L41 in the direction R is 1 mm through 5 mm. This is for a similar reason to the reason (2) described above.

(4) The holding pin 41 shown in FIG. 11C preferably has a shape of a triangle pole in which the width W49 of the line contact portion 49 with the substrate is 1 mm through 4 mm and the length L41 in the direction R is 1 mm through 5 mm. This is for a similar reason to the reason (2) described above.

(5) The holding pin 41 shown in FIG. 11D preferably has a shape of a square pole in which the width W49 of the line contact portion 49 with the substrate is 1 mm through 4 mm and the length L41 in the direction R is 1 mm through 5 mm. This is for a similar reason to the reason (2) described above.

Figure 12A:
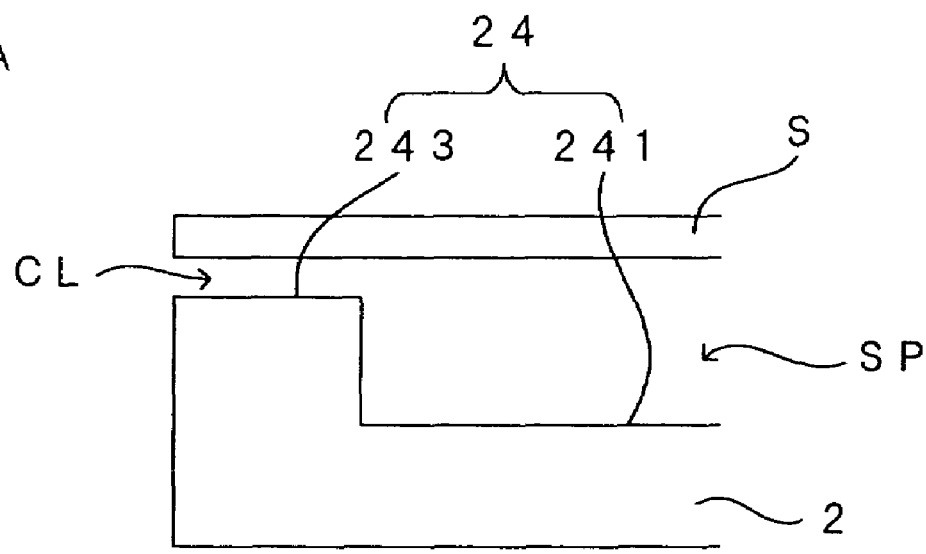
FIGS. 12A through 12C are drawings which show a modification of the atmosphere blocking member.
Figure 12B:
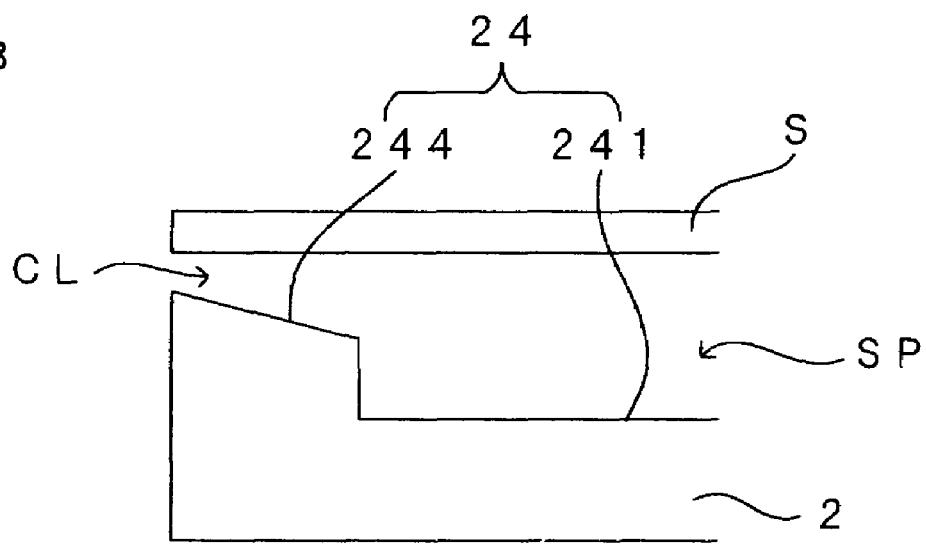
Figure 12C:
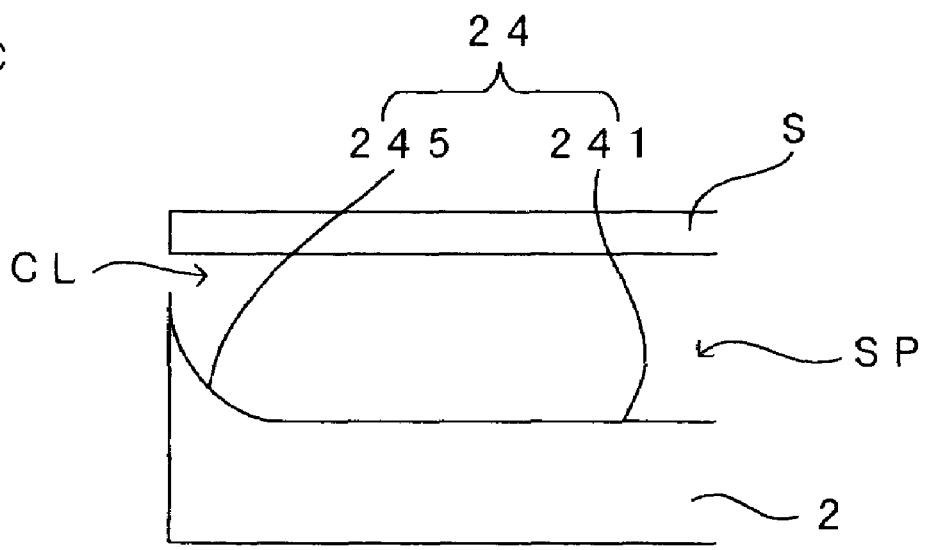

The present invention is not limited to the preferred embodiments above, but may be modified in various manners in addition to the preferred embodiment above, to the extent not deviating from the object of the invention. For instance, although the preferred embodiment described above uses the atmosphere blocking member 2 comprising the substrate-facing surface 24 which is formed by the central area 241 and the periphery edge area 242, the shape of the substrate-facing surface is not limited to this. Instead, as shown in FIGS. 12A through 12C, the atmosphere blocking member 2 comprising the substrate-facing surface 24 which becomes closer to a substrate with a distance toward the periphery edge of the substrate-facing surface 24 may be used. That is, in the case of the atmosphere blocking member 2 shown in FIG. 12A, the substrate-facing surface 24 is formed by the central area 241 which is shaped like a flat surface and is relatively away from an approximately central portion of the substrate S and a periphery edge area 243 which is shaped like a flat surface and is relatively close to the periphery edge of the substrate S. Meanwhile, in the case of the atmosphere blocking member 2 shown in FIG. 12B, the substrate-facing surface 24 is formed by the central area 241 which is shaped like a flat surface and is relatively away from an approximately central portion of the substrate S and a periphery edge area 244 which is shaped like an angled surface and is relatively close to the periphery edge of the substrate S. Further, in the case of the atmosphere blocking member 2 shown in FIG. 12C, the substrate-facing surface 24 is formed by the central area 241 which is shaped like a flat surface and is relatively away from an approximately central portion of the substrate S and a curved surface 245 which becomes dramatically close to the substrate S with a distance toward the periphery edge of the substrate S.

In addition, although an approximately central portion of the substrate-facing surface 24 is the central area 241 which is shaped like a flat surface in the preferred embodiment described above, the substrate-facing surface 24 may become gradually closer to the substrate S with a distance toward the periphery edge of the substrate-facing surface 24 also in the approximately central portion of the substrate-facing surface 24.

Further, while the atmosphere blocking member 2 is obtained by fastening the flat panel member 21 and the ring member 22 with the fastening member 23 in the preferred embodiment described above, the atmosphere blocking member may be formed by three or more members, or conversely, only one member.

Further, while a substrate S which is shaped approximately like a disk and comprises the notch NT at the periphery edge is processed in the preferred embodiment described above, the present invention is applicable to substrates having various types of shapes. In short, the present invention is applicable to a substrate processing apparatus which executes predetermined substrate processing on one major surface of a substrate, which is obtained by forming a substrate nick portion at a periphery edge of a plate-like member which has a predetermined shape, while supplying a processing liquid to one major surface of the substrate. When the apparatus comprises substrate supporting means which supports a substrate and an atmosphere blocking member which is disposed in the vicinity of the substrate and faced with the other major surface of the substrate which is supported by the substrate supporting means and when the atmosphere blocking member has the following structure, the apparatus realizes a similar effect to that according to the preferred embodiment described above.

Other preferred embodiment may be that an outer shape of the atmosphere blocking member is approximately a similar figure to the plate-like member whose rate of similarity is expressed by the following inequality:

(the rate of similarity)≦$Wsb/(Wsb+Wnt)$

Further, the atmosphere blocking member may be disposed so that a central axis of the atmosphere blocking member matches with a central axis of a substrate. In the case of such an atmosphere blocking member, too, which has such a structure, the periphery edge of the atmosphere blocking member remains closer to the central axis than the substrate nick portion is, without sticking out beyond the substrate S in the horizontal direction. This prevents exposure of the atmosphere blocking member to an atmosphere which is splashed with a mist. The mist will therefore not collide with the atmosphere blocking member, thereby preventing the mist from invading the other major surface of the substrate and effectively obviating adhesion of the mist to the other major surface of the substrate.

In addition, while the preferred embodiment described above is directed to an application of the present invention to a substrate processing apparatus which uses the atmosphere blocking member 2 comprising the substrate-facing surface 24 which becomes closer to a substrate with a distance toward the periphery edge of the substrate-facing surface 24, applications of the present invention are not limited to this. Rather, the present invention is generally applicable to any substrate processing apparatus in which an atmosphere blocking member is disposed in the vicinity of other major surface of a substrate to thereby block an atmosphere. For example, the present invention is applicable also to a substrate processing apparatus which uses a vertically movable member which is shaped like a flat plate (which corresponds to an "atmosphere blocking member" of the present invention) as described in Japanese Patent Application Laid-Open Gazette No. H7-130695 (U.S. Pat. No. 2845738). In short, a similar effect to that according to the preferred embodiment described above is attained as a atmosphere gas is supplied to a microspace between a vertically movable member and a substrate such that a gap between other major surface of the substrate and a periphery edge of the vertically movable member is 0.3 mm through 1 mm.

Further, although the preferred embodiment described above requires to dispose the atmosphere blocking member 2 on the spin base 1, the spin base 1 may function as an "atmosphere blocking member" of the present invention. In this case, since the top surface of the spin base 1 is to correspond to a "substrate-facing surface" of the present invention, the spin base 1 may be structured so that the top surface of the spin base 1 becomes closer to a substrate with a distance toward the periphery edge of the spin base 1 and that a gap between the periphery edge of the spin base 1 and the other major surface S2 of a substrate S is 0.3 mm through 1 mm.

Further, although a substrate S is transferred onto the support pins 3 from the lift mechanism 8 and so that the support pins 3 support the substrate S at the substrate processing position P83 in the preferred embodiment described above, the substrate S may be positioned at the substrate processing position P83 without disposing support pins while supporting the substrate S by the support parts 82 of the lifter pin stands 81 and the substrate S may be then rinsed.

Further, although the preferred embodiment described above uses the six lifter pin stands 81, the number, the shape and the like of the lifter pin stands 81 are not limited to this. As long as the front edges of the lifter pin stands are finished so as to fit with a periphery edge of a substrate and the lifter pin stands can freely move in the vertical direction to follow the periphery edge of the substrate at the substrate processing position described earlier, the number, the shape and the like of the lifter pin stands 81 may be freely determined.

Further, although the preferred embodiment described above is directed to an application of the present invention to a substrate processing apparatus which supplies a rinsing liquid to a substrate and rinses the substrate, applications of the present invention are not limited to this. Rather, the present invention is generally applicable to any substrate processing apparatus in which a processing liquid is supplied to one major surface of a substrate which is positioned at a predetermined substrate processing position and supported approximately horizontally and this major surface is subjected to predetermined substrate processing.

In addition, while the substrate processing apparatus according to the present invention may be used as it is alone, the substrate processing apparatus according to the present invention may be combined with a substrate processing apparatus which executes other substrate processing, a transportation unit or an indexer which transport a substrate, etc., to thereby form a substrate processing system. One such example is a substrate processing system shown in FIG. 13. A preferred embodiment of a substrate processing system according to the present invention will now be described with reference to FIGS. 13, 14A and 14B.

FIG. 13 is a drawing which shows a preferred embodiment of the substrate processing system according to the present invention. The illustrated substrate processing system is a system that a substrate S housed in a pod 110 is taken out, a back surface of the substrate (which is a surface not forming any circuit) is rinsed, and the substrate is returned back to the pod 110.

In this substrate processing system, as shown in FIG. 13, an indexer ID is disposed on the upstream side (the left-hand side in FIG. 13) and a process part PP which rinses a back surface (i.e., "one major surface" of the present invention) of a substrate S is disposed on the upstream side (the right-hand side in FIG. 13).

Within the indexer ID, four pods 110 for housing substrates S are arranged in a line along an X-direction. A substrate transportation robot 120 which is widely used moves in the arrangement direction X, loading a substrate S yet to be rinsed from one of the pods 110 and transporting this substrate S to the process part PP or receiving a rinsed substrate S from the process part PP and housing the substrate S back in the pod 110. For the convenience of description, each drawing shows XYZ-axes of Cartesian coordinates in which the vertical direction is Z and a direction perpendicular to the arrangement direction X of the pods 110 is a "Y-direction".

In the process part PP which is disposed on the (+Y)-side to the indexer ID, a center robot 200 is installed in approximately center portion of the process part PP. The center robot 200 may have the same structure as a substrate transportation robot which is very popular. The center robot 200 functions as a "transportation unit" of the present invention. Disposed around the center robot 200 are back surface cleaning units 300A through 300D whose structure is the same as that of the substrate processing apparatus of the preferred embodiment described above and a reversing unit 400. The back surface cleaning units 300A through 300D which correspond to "processing units" of the present invention will not be described here.

Figure 14A:
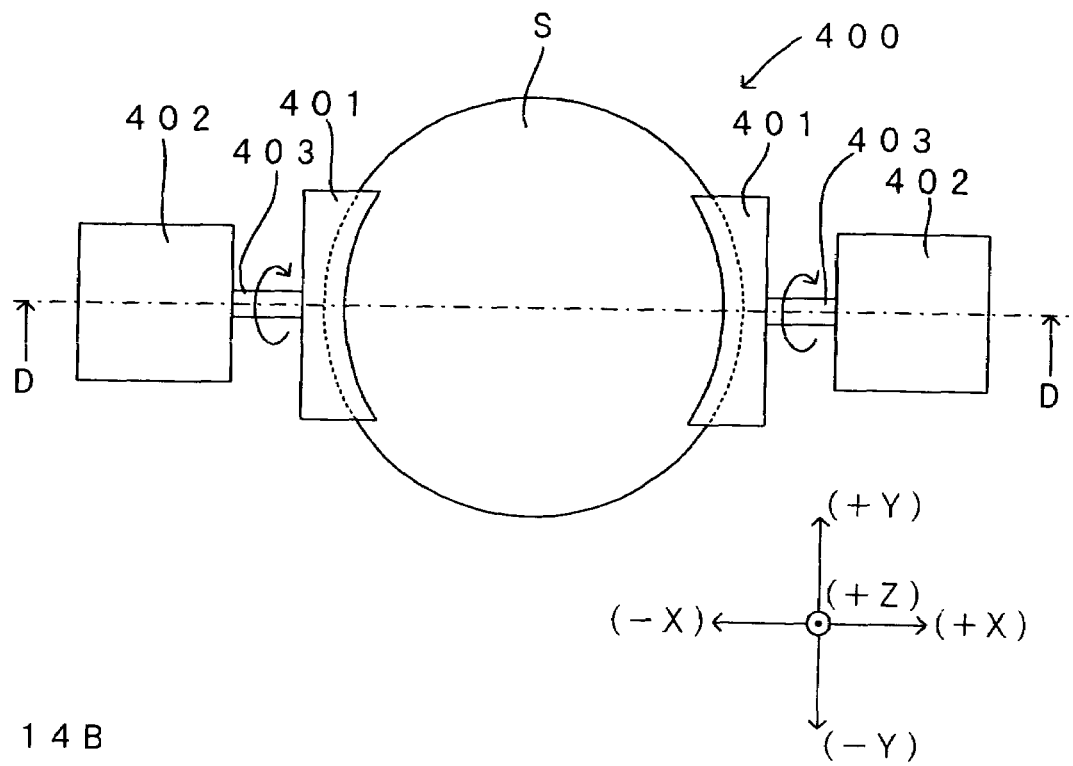
FIGS. 14A and 14B are drawings which show a structure of a reversing unit Which is disposed to the substrate processing system which is shown in FIG. 13.
Figure 14B:
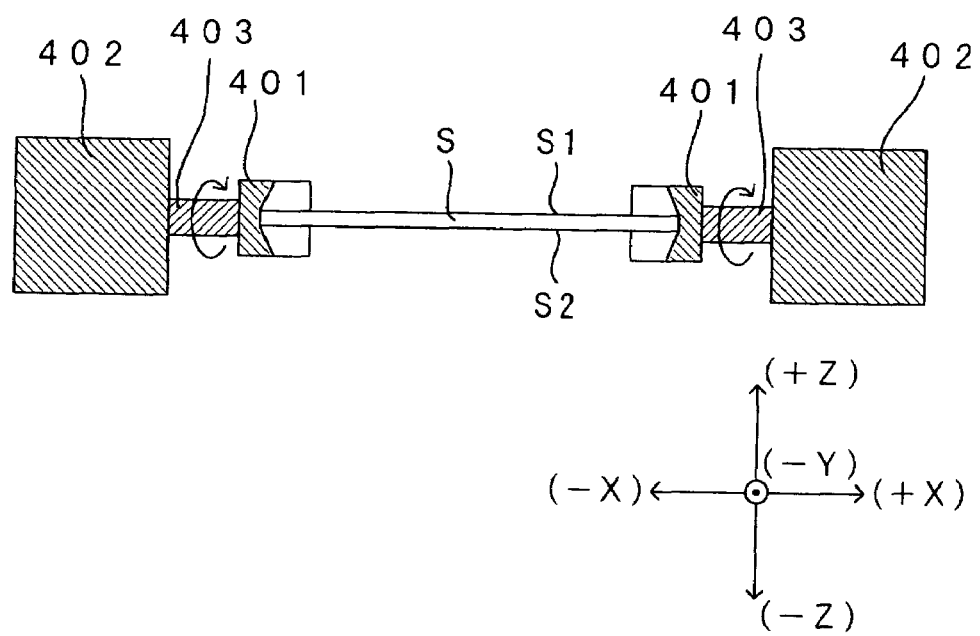

FIGS. 14A and 14B are drawings which show a structure of a reversing unit which is disposed to the substrate processing system which is shown in FIG. 13. FIG. 14A is a plan view of the reversing unit as it is viewed from above, while FIG. 14B is a cross sectional view of FIG. 14A taken along the D-D line. The reversing unit 400 comprises a pair of substrate chucks 401, 401 for transferring a substrate S between the reversing unit 400 and the center robot 200. The substrate chucks 401, 401 are independent of each other and away from each other. Each substrate chuck 401 is attached to a front edge of a rod 403 of a rotary cylinder 402, so that the substrate chuck 401 moves in the X-direction as the rod 403 moves in the X-direction and rotates 180 degrees about the rod 403 as the rod 403 rotates.

Hence, the substrate transportation robot 120 of the indexer ID and the center robot 200 transport an unprocessed substrate S between the substrate chucks 401, 401 which are apart from each other, the rods 403 extend, the substrate chucks 401, 401 firmly hold the substrate S as shown in FIGS. 14A and 14B, and the center robot 200 then retracts. The rods 403 rotate 180 degrees following this. In consequence, the substrate S which remains in a loaded state from the pod 110, that is, a state that a surface forming a circuit and the like (which corresponds to "other major surface" of the present invention) S2 is directed to above, is reversed and postured face-down. The back surface S1 of the substrate S thus becomes directed toward above. The reversing unit 400 transfers the substrate S as it is face-down to the center robot 200.

Meanwhile, when the center robot 200 transports a rinsed substrate S as it is face-down from the back surface cleaning units 300A through 300D to the reversing unit 400, the rinsed substrate S is reversed in a manner similar to that for reversing an unprocessed substrate S. As a result, the substrate S becomes face-up again, that is, returns to a state that the surface S2 forming a circuit and the like is directed toward above. The reversing unit 400 transfers thus postured substrate S to the substrate transportation robot 120.

As a transportation device such as an AGV (automated guided vehicle) transports the pod 110 which houses a plurality of substrates S whose substrate surfaces S2 are directed to above to the indexer ID of the substrate processing system which has such a structure, each substrate S is cleaned on a back surface in the following manner. In the following, an operation of the system will be described in relation to only one of the substrates S.

First, the substrate transportation robot 120 loads the substrate S as it is face-up from the pod 110 and transfers the substrate S to the center robot 200, and the center robot 200 transports the substrate to the reversing unit 400 (loading). Receiving the substrate S, the reversing unit 400 reverses the substrate S and transfers the substrate S as it is face-down to the center robot 200. The center robot 200 inserts the substrate to one of the four back surface cleaning units 300A through 300D.

In one of the back surface cleaning units, as a preparation to receive the unprocessed substrate S from the center robot 200, the lifter pin stands 81 ascend and the support parts 82 are accordingly positioned at the substrate transfer position P81. Upon receipt of the unprocessed substrate S at the substrate transfer position P81 from the center robot 200, the back surface cleaning unit performs the same operation as that of the substrate processing apparatus of the preferred embodiment described above, thereby rinsing the back surface S1 of the substrate S (back surface cleaning). At this stage, as in the substrate processing apparatus described above, the atmosphere blocking member 2 isolates the surface (other major surface) S2 of the substrate S from a mist-splashed atmosphere, the micro-space SP becomes positively pressurized as compared with the mist-splashed atmosphere (the region around the substrate S), and the flow velocity of the atmosphere gas which gushes out from the micro-clearance CL enhances. Hence, it is possible to effectively prevent a mist created during rinsing from adhering to the surface S2 of the substrate S. In addition, owing to a similar structure of the atmosphere blocking member 2 to that according to the preferred embodiment described above which considers the notch NT formed at the periphery edge of the substrate S, it is possible to prevent a mist which passed through the notch NT from colliding with the atmosphere blocking member 2, and hence, the mist from invading the surface S2 of the substrate S. In short, it is possible to rinse the back surface S1 alone of the substrate S while preventing adhesion of a mist to the surface S2 of the substrate S without fail, thereby realizing excellent cleaning of the back surface.

Upon completion of the back surface cleaning, the lifter pin stands 81 ascend from the lower limit position (retracted position) P82, receive the processed substrate S from the support pins 3 and move up and are positioned at the substrate transfer position P81. The center robot 200 receives the processed substrate S at the substrate transfer position P81, and transports the processed substrate S to the reversing unit 400. After the reversing unit 400 makes the substrate face-up, the center robot 200 receives the substrate S and transfers the substrate S to the substrate transportation robot 120, and the substrate transportation robot 120 returns the substrate back into the pod 110 (unloading).

Although the substrate processing system according to this embodiment comprises the four back surface cleaning units 300A through 300D as "processing units" of the present invention, the number, the arrangement and the like of the back surface cleaning units may be determined freely. As for the substrate processing system, any system attains the effect described above as long as the system comprises at least processing units whose structure is the same as that of the substrate processing apparatus of the preferred embodiment described above and a transportation unit which transports substrates to these processing units. Hence, other unit may be added in addition to these processing units and a transportation unit in order to build the substrate processing system.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. In combination, a substrate processing apparatus and a substrate, wherein a processing liquid is supplied to one major surface of a substrate for a predetermined substrate processing, comprising:

three or more support members disposed in said processing apparatus, which abut a peripheral edge of said substrate and accordingly support said substrate;

said substrate having a notch at said peripheral edge of said substrate;

an atmosphere blocking member which faces another major surface of said substrate and is spaced away from said substrate;

said atmosphere blocking member having a radius which is smaller than a radius of said substrate by a radial width of the notch at the peripheral edge of said substrate, and is so constructed and arranged that a peripheral edge of said atmosphere blocking member is not exposed around said substrate through the notch;

wherein a substrate-facing surface of said atmosphere blocking member which faces the other major surface of said substrate becomes closer to the other major surface of said substrate with a distance toward said peripheral edge of said atmosphere blocking member;

said three or more support members being disposed at a said peripheral edge of said atmosphere blocking member; and a gas supplying unit which supplies an atmosphere gas to a space which is created between said atmosphere blocking member and said substrate.

2. The combination of claim 1, whereby the atmosphere blocking member prevents a mist from passing through said notch from said one major surface of said substrate, to said other major surface of said substrate.

3. The combination of claim 1, wherein said atmosphere blocking member and said notched substrate cooperate to prevent a mist generated by liquid processing of said one major surface of said substrate, from passing through said notch and reaching said other major surface of said substrate.

* * * * *